United States Patent
Cavallaro

(10) Patent No.: US 6,258,165 B1
(45) Date of Patent: *Jul. 10, 2001

(54) HEATER IN A CONVEYOR SYSTEM

(75) Inventor: William A. Cavallaro, Bradford, MA (US)

(73) Assignee: Speedline Technologies, Inc., Franklin, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/743,011

(22) Filed: Nov. 1, 1996

(51) Int. Cl.[7] .............................. B05B 3/00; B05B 13/02; B05B 5/00; B05C 11/00
(52) U.S. Cl. .............................. 118/323; 118/58; 118/68; 118/324; 118/641; 228/20.1
(58) Field of Search .............................. 118/58, 68, 323, 118/324, 641, 642, 643; 228/9, 20.1, 102, 103, 180.2, 230, 232

(56) References Cited

U.S. PATENT DOCUMENTS

| | | | |
|---|---|---|---|
| 3,689,333 | * 9/1972 | Hillhouse | 118/323 |
| 5,128,506 | 7/1992 | Dahne et al. | 219/85.13 |
| 5,147,690 | * 9/1992 | Faust et al. | 427/372.2 |
| 5,221,347 | * 6/1993 | Heine | 118/630 |
| 5,232,145 | 8/1993 | Alley et al. | 228/102 |
| 5,345,061 | 9/1994 | Chanasyk et al. | 219/388 |
| 5,460,120 | * 10/1995 | Paul et al. | 118/264 |
| 5,462,599 | * 10/1995 | Kuster | 118/503 |
| 5,588,996 | * 12/1996 | Costello | 118/668 |

FOREIGN PATENT DOCUMENTS 0106564   4/1984  (EP).

OTHER PUBLICATIONS

EP 0 279 604 A (Hollis Automation Inc.) Aug. 24, 1988.

* cited by examiner

Primary Examiner—Donald E. Czaja
Assistant Examiner—Jacqueline A. Ruller
(74) Attorney, Agent, or Firm—Mintz, Levin, Cohn, Ferris, Glovsky and Popeo, P.C.

(57) ABSTRACT

In a conveyor system with a radiant heating system, convection is provided with hollow elongated tubes having small holes for providing a gentle air flow toward a workpiece to heat the workpiece with convection and radiation.

16 Claims, 2 Drawing Sheets

HEATER IN A CONVEYOR SYSTEM

BACKGROUND OF THE INVENTION

This invention relates to a heater for an oven with a conveyor, and more particularly to a heating system for use with a liquid dispensing system.

In the manufacture of printed circuit boards, liquid dispensing systems can be used to dispense liquids on the circuit board. Different types of dispensers can be used to dispense different types of liquids for different purposes. One application of a liquid dispenser is for dispensing glue for mounting components on the board. Another application for a liquid dispenser arises after a packaged chip has been mounted to a circuit board. The liquid dispenser dispenses a bead of liquid around the perimeter of the chip. The liquid wicks under the chip to underfill it, thereby thermally conducting heat away from the packaged chip. In another application, a die can be mounted to a circuit board, and then the liquid dispenser dispenses a viscous liquid over the die. The liquid hardens to encapsulate the die in place on the board. In such liquid dispensing systems, a conveyor transports a circuit board along a direction of travel until it reaches a desired position where the conveyor stops and the dispensing is performed.

The underfill and encapsulation processes are typically performed in a heated environment. A radiant heater heats the circuit board from below while the liquid dispenser dispenses liquid from above. One type of heater has a number of quartz tubes mounted in parallel, transverse to the direction of travel. The quartz tubes enclose coils that quickly heat to a high temperature with an electric current. These tubes, however, tend to create relatively hotter and relative cooler areas on a circuit board.

In ovens used for reflow soldering, convection can be added to the radiant heating by providing a fan to blow air across the radiant heat source. A plate with a series of holes is positioned between the fan and the radiant heat source, or the radiant heat source can itself be a panel with holes. Because of the circular air flow from the fan, however, the temperature of the air that flows through the openings is inconsistent from one hole or group of holes to others. Another drawback with such a system is that the fan pushes a large volume of hot air that provides great heat to the outside environment.

OBJECTS AND SUMMARY OF THE INVENTION

It is an object of the present invention to provide convection heating in a conveyor system, and particularly for use with a liquid dispensing system in which liquid is dispensed on a circuit board in a heated environment.

It is another object of the present invention to provide convection to a heating system without producing excessive airflow.

According to the present invention, a system for operating on a workpiece, such as a circuit board, has a conveyor for transporting the circuit board along a direction of travel to a working position. A heater is mounted on one side of the circuit board when the circuit board is in the working position, and a hollow tube is mounted so that the heater is between the circuit board and the hollow tube. The tube has holes oriented to direct a gas, such as air, toward the heater and the circuit board. Preferably a number of tubes are arranged in parallel, with each made to facilitate heating of the air inside the tubes.

The present invention provides a conveyor system with a simple and easily manufactured convection system that provides a low volume of air in a consistent manner to provide even and consistent convection heating to a workpiece, such as a circuit board, when it is being operated on in a working position. Other features and advantages will become apparent from the following detailed description, drawings, and claims.

DETAILED DESCRIPTION

Figure 1:
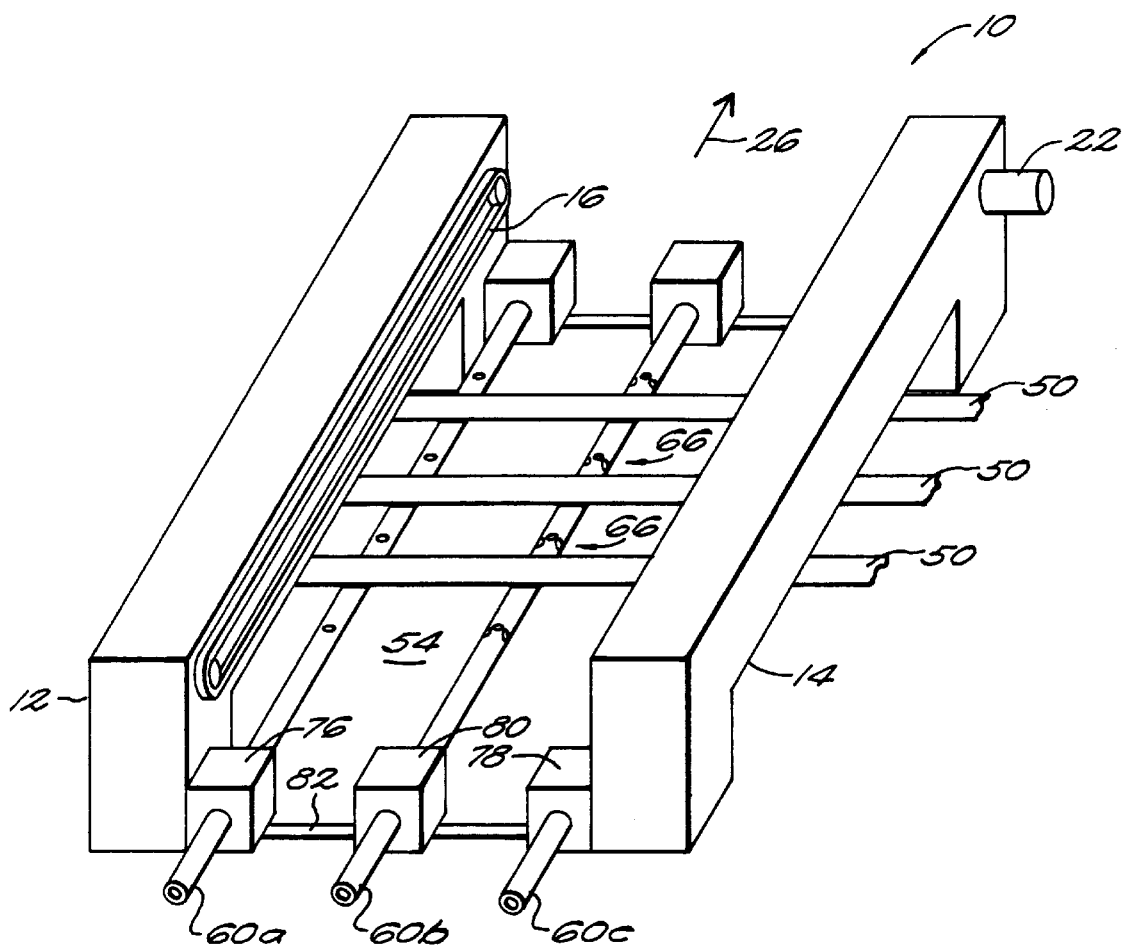
FIG. 1 is a perspective view of a conveyor system according to the present invention.
Figure 2:
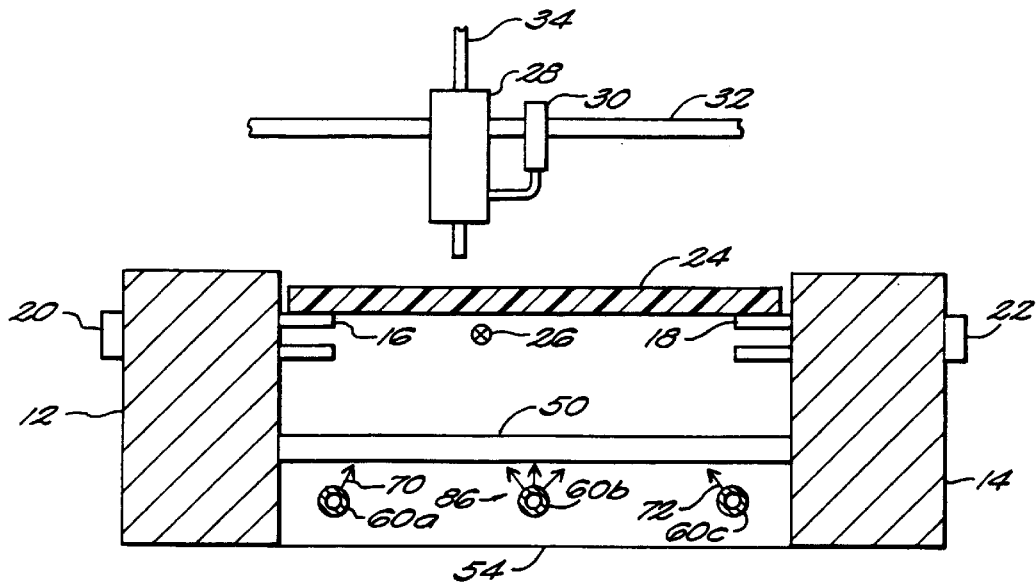
FIG. 2 is a part elevational side view, part cross-sectional view of the system of FIG. 1 shown with a liquid dispenser.

Referring to FIGS. 1 and 2, a conveyor system 10 has two elongated rails 12, 14 spaced apart and parallel to each other. Each rail 12, 14 supports a conveyor belt 16, 18 driven by a controllable motor 20, 22 for transporting workpieces, such as printed circuit boards 24, along a direction of travel 26. Circuit boards are transported by conveyor belts 16, 18 one at a time to a working position as detected by sensors (not shown). The rails are mounted in a track transverse to the direction of travel such that the distance between rails 12, 14 can be adjusted for different size circuit boards.

Referring particularly to FIG. 2, in a liquid dispensing system, when the circuit board is in the working position, motors 20, 22 stop conveyor belts 16, 18 and a liquid dispensing valve 28 is lowered to dispense liquid onto the circuit board 24. The liquid for dispensing is held in a syringe 30 coupled to valve 28. Valve 28 and syringe 30 are mounted for movement along three mutually orthogonal axes. As shown generally in FIG. 2, lead screws 32 and 34 are used to move the valve along the x-axis and the z-axis (y-axis is not shown but could include a rail that supports lead screws 32, 34). A computer system (not shown) controls the movement of valve 28 and its operation to dispense liquid at desired locations. Exemplary liquid dispensing systems are manufactured and sold by Camelot Systems, Inc. of Haverhill, Mass. under the name CAM/ALOT®. These dispensing systems use a rotary positive displacement pump approach with liquid held under low continuous pressure. Other types of liquid dispensing valves could be used.

A number of different liquids can be dispensed to accomplish one of a number of different objectives. For example, the liquid can be a glue for bonding components to the circuit board, an underfill material deposited around a mounted packaged chip to underfill the chip, or an encapsulating liquid that hardens over a die to encapsulate it on the circuit board.

Figure 3:
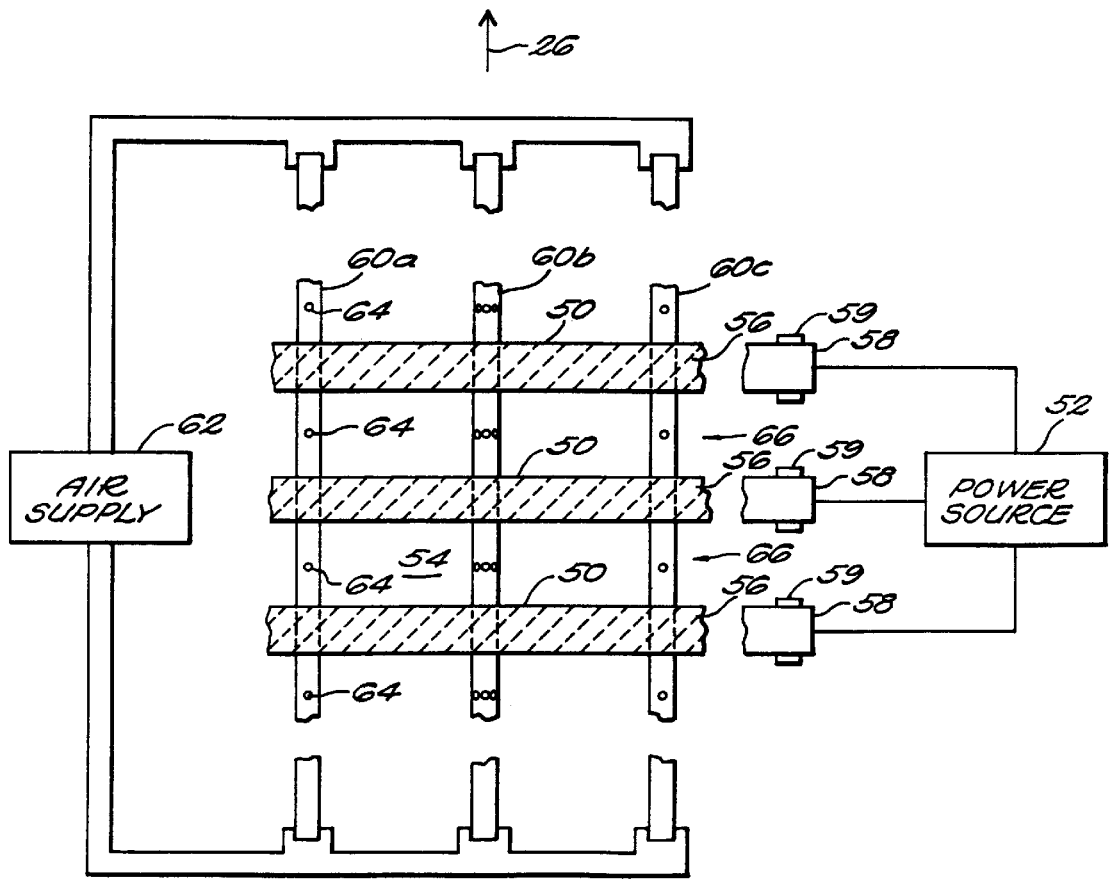
FIG. 3 is a part schematic, part plan view illustrating heating coils and tubes according to the present invention.

As shown in FIGS. 1–2 and particularly in FIG. 3, a number of elongated quartz heating tubes 50 are oriented in parallel and transverse to direction of travel 26. Each heating tube 50 encloses a coil 56 connected at each end to a conductive end cap 58. End caps 58 snap in and out of spring clamps 59, which are electrically coupled to an electric power source 52. Source 52 energizes coils 56, causing heating tubes 50 to heat very quickly and provide radiant heat to the circuit board. Underneath the heating tubes is a highly reflective floor 54. While tubes 50 can be replaced, they are stationary during operation of the system.

While three heating tubes 50 are shown in FIGS. 1 and 3 for illustrative purposes, there would typically be many more such tubes, e.g., one every 1.5 inches (3.75 cm) over a length of 6 feet (180 cm). Furthermore, groups of heating tubes can be controlled separately from other groups of heating tubes to define multiple heating zones, such as a pre-heat zone, a dispensing zone, and a post-heat zone.

The discussion to this point relates to components that are known or have been used in heated dispensing systems.

According to the present invention, a number of elongated hollow tubes 60a–60c, coupled at each end to an air supply 62, are mounted transverse to heating tubes 50, i.e., parallel to the direction of travel 26. In an exemplary embodiment, these tubes have a 0.25 inch (6.35 mm) outer diameter and a 1/32 inch (0.8 mm) wall for a cross-sectional area of 0.04 in$^2$ (24 mm$^2$). Tubes 60a–60c are made of black anodized aluminum to facilitate the absorption of radiant energy from heating tubes 50 and thus to effectively preheat the air in tubes 60a–60c.

Tubes 60a–60c have holes 64 oriented to provide air from air supply 62 upwardly toward heating tubes 50 and hence toward the circuit board. In the exemplary embodiment, holes 64 are each about 0.010 inches (0.25 mm) in diameter and are at locations 66 about midway between heating tubes 50. At each location 66, there can be one or more holes 64 for providing air. As shown in FIG. 3, the holes are preferably located halfway between pairs of adjacent heating tubes 50, or outside heating tubes at the ends of rows.

Referring to FIGS. 1 and 2, in an exemplary embodiment, the system has two outer tubes 60a, 60c that are parallel and adjacent rails 12, 14. Outer tubes, 60a, 60c have one hole per location 66, with these holes directed slightly at an angle so that air flow is upwardly and inwardly as shown by arrows 70, 72 in FIG. 2. Positioning outer tubes 60a, 60c near rails 12, 14 is useful because the rails tend to function as heat sinks. Tubes 60a, 60c are mounted with mounting blocks 76, 78 that are coupled to rails 12, 14 for lateral movement with the rails.

A third tube 60b is mounted parallel and between tubes 60a, 60c with a mounting block 80. Block 80 is laterally movable in a channel 82 so that tube 60b can be repositioned midway between rails 12, 14 if the distance between the rails is adjusted. Tube 60b has three holes at each location 66. One hole is oriented to direct air straight upwardly, and two holes on each side are directed upwardly and outwardly as shown by arrows 86 in FIG. 2.

The amount of air provided into each end of each tube is preferably about one pound, or 25 lb/in$^2$ (8.8 kg/cm$^2$), to produce a gentle turbulence from holes 64. While fan-based convection produces a high volume of air flow with uneven heat, the convection according to the present invention provides a more gentle and even flow of warm air underneath the circuit board to reduce variations in heating from heating tubes 50.

Having described a preferred embodiment of the present invention, it should be apparent that other modifications can be made without departing from the scope of the present invention as defined by the appended claims. For example, the hollow tubes can be made of a different material and have different dimensions from those described; moreover, more or fewer air tubes could be used as desired, and depending on the distance between the rails and the size of each circuit board. While the invention has been described for use with a conveyor, other systems, such as robotic systems, could be used for moving a workpiece, such as a circuit board, while other supports, such as stationary shelves or clamps could be used to support the workpiece while it is worked on.

What is claimed is:

1. A liquid dispensing system for dispensing liquid on a circuit board comprising:
   a conveyor for transporting the circuit board along a direction of travel to a working position;
   a liquid dispenser mounted for dispensing liquid on the circuit board when the circuit board is in the working position;
   a heater mounted under the conveyor when the circuit board is in the working position for heating the circuit board, the heater having at least one elongated heating tube; and
   a first elongated hollow tube mounted under the heater and having holes oriented so that when a gas is introduced into the first tube, the gas is directed upwardly through the holes, past the heater, and toward the circuit board, the elongated hollow tube being mounted transverse to the heating tube and parallel to the direction of travel.

2. The system of claim 1, further comprising a second hollow tube mounted parallel to the first tube and having holes oriented to direct a gas through the holes upwardly past the heater and toward the circuit board.

3. A liquid dispensing system for dispensing liquid on a circuit board comprising:
   a conveyor for transporting the circuit board along a direction of travel to a working position;
   a liquid dispenser mounted for dispensing liquid on the circuit board when the circuit board is in the working position;
   a heater mounted under the conveyor when the circuit board is in the working position for heating the circuit board;
   a first elongated hollow tube mounted under the heater and having holes oriented so that when a gas is introduced into the first tube, the gas is directed upwardly through the holes, past the heater, and toward the circuit board; and
   a second hollow tube mounted parallel to the first tube and having holes oriented to direct a gas through the holes upwardly past the heater and toward the circuit board;
   wherein the conveyor has first and second parallel rails elongated along a first direction, the rails being movable relative to each other in a second direction transverse to the first direction, the first and second tubes being coupled to move along the second direction with the rails.

4. The system of claim 3, further comprising a third hollow tube mounted parallel with and between the first and second tubes.

5. The system of claim 4, wherein the heater includes a plurality of elongated heating tubes mounted in parallel and extending transverse to the direction of travel.

6. The system of claim 5, wherein the holes of the first tube are at locations halfway between pairs of adjacent heating tubes.

7. The system of claims 1, further comprising an air supply coupled to each end of the first tube for providing air at each end.

8. The system of claim 1, wherein the first tube is made of black anodized aluminum.

9. The system of claim 1, wherein the heater includes a plurality of heating tubes mounted in parallel and extending transverse to the direction of travel.

10. The system of claim 9, wherein the holes of the first tube are at locations halfway between adjacent heating tubes.

11. The system of claim 1, further comprising a second hollow tube, wherein the heater includes a plurality of elongated heating tubes mounted in parallel and extending transverse to the direction of travel.

12. The system of claim 11, wherein the holes of the first tube are at locations halfway between pairs of adjacent heating tubes.

13. A system for conveying and heating a work piece comprising:
   a conveyor for transporting the work piece along a direction of travel;
   a heater mounted on one side of the conveyor for heating the work piece, the heater having at least one elongated heating tube; and
   a first hollow elongated tube mounted so that the heater is between the work piece and the first tube, the first tube having a plurality of holes oriented so that when a gas is introduced into the first tube, the gas is directed through the holes, past the heater and toward the work piece, the first elongated hollow tube being mounted transverse to the heating tube and parallel to the direction of travel.

14. The system of claim 13, further comprising a second hollow tube mounted parallel to the first tube and having holes oriented so that when a gas is introduced into the second tube, the gas is directed upwardly through the holes in the second tube, past the heater, and toward the circuit board.

15. A system for conveying and heating a work piece comprising:
   a conveyor for transporting the work piece along a direction of travel;
   a heater mounted on one side of the conveyor for heating the work piece;
   a first hollow elongated tube mounted so that the heater is between the work piece and the first tube, the first tube having a plurality of holes oriented so that when a gas is introduced into the first tube, the gas is directed through the holes, past the heater and toward the work piece; and
   a second hollow tube mounted parallel to the first tube and having holes oriented so that when a gas is introduced into the second tube, the gas is directed upwardly through the holes in the second tube, past the heater and toward the circuit board;
   wherein the conveyor has first and second parallel rails elongated along a first direction, the rails being movable relative to each other in a second direction transverse to the first direction, the first and second tubes being coupled to move along the second direction with the rails.

16. The system of claim 13, further comprising an air supply coupled to each end of the tube.

* * * * *